United States Patent [19]

Dombrowski et al.

[11] Patent Number: 5,853,800
[45] Date of Patent: Dec. 29, 1998

[54] MATERIAL FOR AND METHOD OF PREPARING WATER-REPELLENT COATINGS ON OPTICAL SUBSTRATES

[75] Inventors: Reiner Dombrowski, Höchst; Martin Friz, Mühltal, both of Germany

[73] Assignee: Merck Patent Gesellschaft mit beschrankter Haftung, Germany

[21] Appl. No.: 736,668

[22] Filed: Oct. 25, 1996

[30] Foreign Application Priority Data

Oct. 26, 1995 [DE] Germany .................. 195 39 789.4

[51] Int. Cl.⁶ .................................................. C23C 16/24
[52] U.S. Cl. ...................... 427/162; 427/167; 427/294; 427/248.1; 427/255.6
[58] Field of Search .................. 427/248.1, 167, 427/162, 294, 255.6

[56] References Cited

U.S. PATENT DOCUMENTS 5,204,314  4/1993  Kirlin et al. .................. 505/1

FOREIGN PATENT DOCUMENTS 535691  4/1993  European Pat. Off. .
5170487 7/1993 Japan .
5215905 8/1993 Japan .
5239243 9/1993 Japan .
6122776 5/1994 Japan .
6175089 6/1994 Japan .

*Primary Examiner*—Shrive Beck
*Assistant Examiner*—Timothy Meeks
*Attorney, Agent, or Firm*—Millen, White, Zelano, & Branigan, P.C.

[57] ABSTRACT

The invention relates to a material for and method of preparing water-repellent coatings on optical substrates. Compounds of formula I $$C_nF_{2n+1}-(CH_2)_m-Si(R^1R^2R^3) \quad (I)$$

in which $R^1$ is alkoxy having 1 to 3 carbon atoms or is $C_nF_{2n+1}-(CH_2)_m-Si(R^2R^3)-O-$, $R^2$ and $R^3$ are alkyl or alkoxy having 1 to 3 carbon atoms, n is 1 to 12; and m is 1 to 6, are applied to the substrates by thermal vapor coating in a high vacuum.

3 Claims, No Drawings

MATERIAL FOR AND METHOD OF PREPARING WATER-REPELLENT COATINGS ON OPTICAL SUBSTRATES

BACKGROUND OF THE INVENTION

The invention relates to a material for and to a method of preparing water-repellent coatings on optical substrates.

It is widespread prior art to provide the surfaces of optical components with thin coatings for their protection or in order to obtain certain functional properties. Optical components of this kind are, in the context of this invention, essentially optical lenses, spectacle lenses, and lenses for cameras, field glasses or for other optical apparatus, beam splitters, prisms, mirrors, window panes, etc. On the one hand, the aim of such coatings is to upgrade the surfaces of optical substrates, such that, by means of hardening and/or increasing the chemical resistance, damage caused by mechanical, chemical or environmental influences is avoided. This is particularly significant in the case of substrates comprising plastics materials. On the other hand, surface coatings are employed in order to reduce reflection, especially in the case of spectacle lenses and other lenses. In this context it is possible, given an appropriate choice of the coating materials, coat thickness, single- or multilayer construction comprising, if appropriate, different materials with differing refractive indices, to achieve a reduction in the reflection to less than 1% over the entire visible spectrum of radiation.

Upgrading or antireflection coats of this kind are produced using numerous oxide materials, for instance $SiO_2$, $TiO_2$, $ZrO_2$, MgO, $Al_2O_3$, and also fluorides such as $MgF_2$, and mixtures of these substances. Optical substrates are usually coated by the high-vacuum vapor deposition technique. In this procedure, the substrate and a charge containing the substance to be applied by vapor deposition are placed inside an appropriate high-vacuum vapor deposition apparatus, which is then evacuated, and then the substance is caused to vaporize by heating and/or by means of electron beams, and is deposited on the surface of the substrate as a thin coat. Appropriate apparatus and methods are common prior art.

Upgrading coats of this kind, however, especially antireflection coats, are extremely sensitive to soiling, for example by moist and/or greasy fingerprints. Impurities cause a strong increase in reflection; therefore, fingerprints become clearly visible. Effective cleaning to re-establish the original reflection level proves to be difficult. For this reason, it has become established practice to provide optical components, in addition, with a hydrophobicizing, i.e. water-repellent coating.

For hydrophobicizing the surfaces of optical substrates there is a range of substances available, in particular from the class of organosilicon compounds. These substances are, for example, silanes, siloxanes, silicones and silicone oils (silicone fluids). In general, these substances are applied by dipping or spin coating to the substrate surfaces to be treated, the substances being employed either in pure form or as solutions. Following surface treatment and, if appropriate, evaporation of solvent, a thermal after-treatment is usually carried out, whereby the water-repellent coating is consolidated and adhesion with the substrate material is brought about. In general, this gives coatings with satisfactory properties in respect of hydrophobicization, durability and long-term adhesion.

However, the coating technique necessary as a result of the nature of the customary hydrophobicizing agents is disadvantageous.

For instance, in dip coating and spin coating it is necessary to operate under strict clean-room conditions in order to rule out negative effects on quality, caused, for instance, by dust particles. Furthermore, these techniques require additional operations with corresponding apparatus and plant.

JP 05-215 905 discloses a process for preparing water-repellent coatings on optical substrates, which involves the application to the substrate surface of fluoroalkylsilazane compounds by means of a high-vacuum vapor deposition technique. An advantage of this process over the customary dip and spin coating techniques is that it can readily be carried out in existing high-vacuum vapor deposition apparatus, for instance directly after the vapor coating of the substrate with antireflection or other upgrading coats. The perfluoroalkylsilazane compounds are preferably introduced in a form in which a porous metallic sintered material is saturated with the substance.

However, it has been found that the use of polyfluoroalkylsilazane compounds in a high-vacuum vapor deposition process of this kind is disadvantageous. The substances per se are already unstable, which manifests itself in their distinct odor of ammonia. They decompose and are not stable on storage. In the course of vapor coating, the compounds suffer at least partial decomposition, during which ammonia gas is liberated. This causes corrosion in the apparatus and in the associated high-vacuum pumps and also, possibly, on the optical substrates; in addition, there is a risk of reaction of ammonia with the pump oils in the high-vacuum pumps.

SUMMARY OF THE INVENTION

The object of the invention was therefore to discover more suitable substances for the preparation of water-repellent coats in high-vacuum vapor coating methods.

It has now been found that compounds of the general formula I

in which $R^1$ is alkoxy having 1 to 3 carbon atoms or is

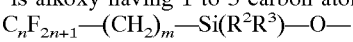

$R^2$ and $R^3$ are alkyl or alkoxy having 1 to 3 carbon atoms n is 1 to 12 m is 1 to 6 are ideally suited to the preparation of water-repellent coatings on optical substrates by thermal vapor coating in a high vacuum.

The invention therefore relates to a method of preparing water-repellent coatings on optical substrates by thermal vapour coating with organosilane compounds in a high vacuum, which is characterized in that vapor coating is performed with compounds of the formula I.

The invention additionally relates to the use of compounds of the formula I for preparing water-repellent coatings on optical substrates.

In the organosilicon compounds of the formula I one radical is a polyfluoroalkyl group composed of a terminal perfluoroalkyl group having 1 to 12 carbon atoms which is attached to the silicon atom via an alkylene group having 1 to 6 carbon atoms. Of the other radicals connected to the silicon atom, $R^1$, $R^2$ and $R^3$, at least one radical ($R^1$) is an alkoxy group having 1 to 3 carbon atoms. The other radicals ($R^2$ and $R^3$) can be alkyl or alkoxy groups each having 1 to 3 carbon atoms. The radical $R^1$ can also be a siloxyl group in which one radical is a polyfluoroalkyl group as described above. The other two radicals attached to the silicon atom ($R^2$ and $R^3$) may, in turn, be the alkyl or alkoxy groups already defined. Examples of typical compounds of the formula I are triethoxy(3,3,4,4,5,5,6,6,7,7,7-undecafluoroheptyl)-silane
triethoxy(3,3,4,4,5,5,6,6,7,7,8,8,8-tridecafluorooctyl)silane
triethoxy(3,3,4,4,5,5,6,6,7,7,8,8,9,9,10,10,10-heptadecafluorodecyl)silane
diethoxymethyl(3,3,4,4,5,5,6,6,7,7,8,8,9,9,10,10,10-heptadecafluorodecyl)silane
bis[ethoxymethyl(3,3,4,4,5,5,6,6,7,7,8,8,8-tridecafluorooctyl)]silyl ether The compounds of the formula I are known per se and the majority of them are commercially available. The remainder can be obtained readily in accordance with known preparation methods.

The compounds of the formula I are exceptionally stable and, in particular, are stable on storage.

It has been found that the compounds can be evaporated readily in a high vacuum at temperatures of between 300° and 500° C., and deposit on substrate surfaces to form thin coats. In this process, the compounds of the formula I either have no tendency to decompose, or any cleavage products are in no way aggressive or corrosive to optical substrates or to the constituents of high-vacuum vapor coating plant, vacuum pumps and pump oils.

For the method according to the invention for preparing water-repellent coats on optical substrates it is possible to employ high-vacuum vapor coating plant as is commonly used to produce optical coats, especially antireflection coats or upgrading coats for surface hardening. In this case, the compounds of the formula I, in appropriate form and manner, are introduced in place of the other vapor coating materials into the apparatus. It is expedient to carry out the vapor coating step with compounds of the formula I directly after preceding vapor coating processes, for instance. for applying antireflection coats, since in this case the substrate is already in the plant. After applying the upgrading coats,no further pretreatment of the substrates is necessary before the vacuum coating by evaporation.

A particularly expedient form of introducing the compounds of the formula I into the vapor coating apparatus is that in which the compound is introduced in a porous, inorganic oxide matrix. A material of this kind for preparing water-repellent coatings on optical substrates by vapor coating in a high vacuum consists, accordingly, of a porous, inorganic oxide matrix containing a compound of the formula I. The porous, inorganic oxide matrix preferably consists of $SiO_2$, $TiO_2$, $ZrO_2$, $MgO$, $Al_2O_3$ or mixtures thereof. Such materials are likewise part of the invention. They are prepared, for instance, by tableting the matrix material, which is usually in finely divided form with particle sizes of between 5 $\mu$m and 20 $\mu$m, and then subjecting these tablets to sintering in the manner customary for the respective material.

For the abovementioned materials, this sintering step is typically carried out at temperatures between 900° and 1400° C. over a period of 1 to 10 hours. Depending on the particle size of the primary particles, on densification and on sintering conditions, the resulting porous sintered articles have a porosity of from 40 to 60%. The sintered articles formed from the porous, inorganic oxide matrix can then be loaded with the compounds of the formula I. This is carried out by impregnating the sintered articles with compounds of the formula I or applying the latter dropwise to the sintered articles, where these compounds are liquid, or by carrying out the same operations with solutions of compounds of the formula I. It is expedient to load the sintered articles with predetermined quantities of compound of the formula I, since by means of the quantitative determination of the content of each such loaded article it is readily possible to predetermine the thickness of the coat on the optical substrate to be coated.

In order to prepare water-repellent coatings on optical substrates it is sufficient to charge a high-vacuum vapour coating plant of conventional kind, into which the substrate to be coated has been introduced, with a compound of the formula I, preferably in the form of a shaped inorganic oxide article loaded with the compound. On reaching a stable final vacuum, for instance in the range between $10^{-3}$ and $10^{-5}$ mbar, the evaporation of the compound of the formula I is brought about by heating at temperatures of from 300° to 500° C. In the course of the process, this compound is deposited on the surface of the optical substrate to form a thin coat. In order to improve adhesion of the coat it may be expedient to heat the substrate to a temperature of between 50° and 300° C. The coat thickness to be achieved is dependent on the duration of the process or, in the case of quantitative evaporation, on the quantity of compound of the formula I introduced. Coat thicknesses of between 2 and 200 nm are commonly established for water-repellent coatings of this type.

The water-repellent coatings produced with the compounds of the formula I exhibit a number of unforeseeable advantages over coats produced using materials which have been employed for this purpose to date. In addition to the fact that the coatings exhibit an exemplary water-repellent behavior, they are considerably more resistant to mechanical and chemical influences. They are substantially more firmly adhering and more durable; their resistance to wiping and scratching, and their stability to moist warm air, physiological saline solution, elevated temperature or the action of UV radiation, is substantially higher than in the case of coatings with materials and methods according to the prior art.

Water-repellent coats with compounds of the formula I according to the method of the invention can be applied to all kinds of optical substrates. Their use is particularly advantageous on optical substrates which have been provided beforehand with thin coats for surface upgrading and/or reflection reduction.

Without further elaboration, it is believed that one skilled in the art can, using the preceding description, utilize the present invention to its fullest extent. The following preferred specific embodiments are, therefore, to be construed as merely illustrative, and not limitative of the remainder of the disclosure in any way whatsoever.

In the foregoing and in the following examples, all temperatures are set forth uncorrected in degrees Celsius and unless otherwise indicated, all parts and percentages are by weight.

The entire disclosures of all applications, patents and publications, cited above and below, and of corresponding application German P 195 39 789.4, filed Oct. 26, 1995, are hereby incorporated by reference.

EXAMPLES Example 1

A mixture containing 20% by weight $SiO_2$ and 80% by weight $Al_2O_3$ of particle size 1 to 10 $\mu$m and a hydraulic press are used to produce tablets with a diameter of 10 mm and a height of 8 mm. These tablets are then sintered for 14 hours at 1200° C. The sintered shaped articles have a porosity of about 40%. Example 2

The shaped articles of Example 1 are immersed in a solution of 1 ml of triethoxy-(3,3,4,4,5,5,6,6,7,7,7- undecafluoroheptyl)silane in 10 ml of isopropanol until completely saturated. After removal from this solution and evaporation of the solvent, each tablet contains about 2% by weight of silane compounds. Example 3

A tablet according to Example 2 is placed in a boat made of sheet molybdenum which is placed into the vaporizer of a commercial high-vacuum vaporization unit (A 700 Q, Leybold). The sheets of glass which are to be coated, measuring 5×5 cm, are fastened to the substrate carrier of the unit. The unit is then evacuated down to a residual pressure of $2 \times 10^{-5}$ mbar. The substrates are heated to about 80° C. The vaporizer is heated to about 350° C. Under these conditions, the substance present in the tablet evaporates and is deposited on the sheets of glass, forming a coat. After a period of 30 seconds, cooling is carried out and the unit is vented. The coat thickness on the substrates is determined as 5 nm. The coats are water-repellent; drops of water applied do not wet the coats, but run off in the form of beads.

The preceding examples can be repeated with similar success by substituting the generically or specifically described reactants and/or operating conditions of this invention for those used in the preceding examples.

From the foregoing description, one skilled in the art can easily ascertain the essential characteristics of this invention, and without departing from the spirit and scope thereof, can make various changes and modifications of the invention to adapt it to various usages and conditions.

What is claimed is:

1. A method of preparing water-repellent coatings on optical substrates comprising thermal vapor coating, said optical substrate with organosilane compounds in a high vacuum, wherein said thermal vaporization is performed at a pressure of from $10^{-3}$ to $10^{-5}$ mbar and comprises impregnating a porous inorganic oxide matrix material with compounds of the formula I $$C_nF_{2n+1}-(CH_2)_m-Si(R^1R^2R^3) \qquad (I)$$

in which $R^1$ is alkoxy having 1 to 3 carbon atoms or is $C_nF_{2n+1}-(CH_2)_m-Si(R^2R^3)-O-$, $R^2$ and $R^3$ are alkyl or alkoxy having 1 to 3 carbon atoms, n is 1 to 12 and m is 1 to 6 evaporating the compounds of formula I from the matrix material in a high vacuum at 300° to 500° C.; and depositing the evaporated compounds on the surface of an optical substrate heated to 50° to 300° C.

2. A method of preparing water-repellent coatings on optical substrates as in claim 1 by thermal vapor coating under vacuum, wherein said optical substrate has at least one coating for surface upgrading and/or anti-reflection.

3. A method according to claim 1, wherein the porous, inorganic oxide matrix consists of $SiO_2$, $TiO_2$, $ZrO_2$, MgO, $Al_2O_3$ or mixtures thereof.

* * * * *